United States Patent
Lepine et al.

(10) Patent No.: US 7,821,252 B2
(45) Date of Patent: Oct. 26, 2010

(54) THREE-PHASE CURRENT SENSOR

(75) Inventors: Gerard Lepine, Peillonnex (FR); Arnaud Labbe, Saint-Julien-en-Genevois (FR); Tho Vo Vinh, Meyrin (SE)

(73) Assignee: Liasons Electroniques-Mecaniques Lem SA, Plan-les-Ouates (CH)

( * ) Notice: Subject to any disclaimer, the term of this patent is extended or adjusted under 35 U.S.C. 154(b) by 151 days.

(21) Appl. No.: 12/063,052

(22) PCT Filed: Jul. 28, 2006

(86) PCT No.: PCT/IB2006/002163
§ 371 (c)(1),
(2), (4) Date: Feb. 6, 2008

(87) PCT Pub. No.: WO2007/020500
PCT Pub. Date: Feb. 22, 2007

(65) Prior Publication Data
US 2008/0231255 A1    Sep. 25, 2008

(30) Foreign Application Priority Data
Aug. 12, 2005  (EP) .................................. 05405475

(51) Int. Cl.
*G01R 15/18* (2006.01)
*G01R 15/20* (2006.01)
*G01R 33/00* (2006.01)

(52) U.S. Cl. ................. 324/117 H; 324/127; 324/117 R
(58) Field of Classification Search ....................... None
See application file for complete search history.

(56) References Cited

U.S. PATENT DOCUMENTS

| 3,054,952 | A | * | 9/1962 | Lehrmann | 324/107 |
| 3,924,160 | A | * | 12/1975 | Maier et al. | 361/94 |
| 6,329,810 | B1 | * | 12/2001 | Reid | 324/117 H |
| 6,348,800 | B1 | * | 2/2002 | Haensgen et al. | 324/500 |
| 6,611,137 | B2 | * | 8/2003 | Haensgen et al. | 324/117 H |
| 7,477,058 | B2 | * | 1/2009 | Montreuil | 324/522 |
| RE40,889 | E | * | 9/2009 | Carlson et al. | 324/74 |
| 2006/0043960 | A1 | * | 3/2006 | Itoh et al. | 324/117 R |

FOREIGN PATENT DOCUMENTS

| DE | 4215900 C1 | 12/1993 |
| EP | 0597404 A | 5/1994 |
| GB | 825137 A | 12/1959 |
| WO | 94/27157 A1 | 11/1994 |

OTHER PUBLICATIONS

International Search Report for PCT/IB2006/002163 issued by the International Search Authority/EPO on Aug. 8, 2005.

* cited by examiner

*Primary Examiner*—Paresh Patel
(74) *Attorney, Agent, or Firm*—Baker & Daniels, LLP

(57) ABSTRACT

A three-phase current sensor for measuring currents ($I_{PH}1$, $I_{PH}2$, $I_{PH}3$) running in three conductors of a three-phase conductor system comprises a first magnetic measuring device (D1) and a second magnetic measuring device (D3). Each magnetic measuring device comprises a magnetic circuit provided with at least two interleaf gaps and a magnetic field sensor arranged in each interleaf gap. The magnetic measuring devices (D1, D3) are positioned on both sides of a central conductor or cavity, thereby enabling a central conductor to be inserted in such a way that one of three phases of the conductor system is formed.

8 Claims, 4 Drawing Sheets

THREE-PHASE CURRENT SENSOR

FIELD OF THE INVENTION

The present invention relates to a sensor for measuring electric currents in a three-phase electrical conduction system.

The present invention is above all intended for measuring three-phase currents of large amplitude.

BACKGROUND

There are many applications where three-phase current sensors are used in the industrial field, i.e. for controlling or monitoring three-phase motors. Typically, in three-phase systems, a current sensor comprising a magnetic circuit in a soft often laminated magnetic material with a gap in which a magnetic field sensor is positioned, is placed around each of the three conductors. A very widespread magnetic field sensor is a Hall effect sensor integrated into an ASIC with terminals for its connection to a printed circuit for processing the signals. The electric current may be measured and the electric power may be inferred therefrom by positioning sensors around two of the three phases under the assumption that the sum of the currents is zero. Nevertheless, if the intention is also to detect possible leakage currents, notably for safety reasons, it is necessary to measure the electric current in the three phases and sensors will be positioned around each of the phases.

Measurement of a strong current poses problems in existing sensors and requires special, cumbersome and costly measurements. Strong currents generate high magnetic fields which may saturate the magnetic circuit of the sensor, causing a non-linear response and consequently errors of measurement. This saturation problem is worsened when the conductors of the three phases are brought closer to each other, since the magnetic field of the adjacent conductors is added to the field generated by the conductor around which the relevant sensor is positioned.

In order to avoid saturation of the magnetic circuit, the section of the magnetic circuit may be increased. In many applications (for example in the automotive field), it is however sought to reduce the bulkiness and the weight of the measuring apparatuses. One of the future applications of current sensors is precisely in the field of controlling electrical power systems for electric motor vehicles where the currents may be very strong because of the relatively low voltage and of the high powers required for propelling the vehicle. By increasing the section of the magnetic circuits, the cost of the sensor is also increased.

Another solution which has been considered is to place at least one of the magnetic field sensors in a notch formed in one of the conductors bearing the three phases in order to reduce the number of magnetic circuits and to limit the saturation problems of these circuits. However, making a notch in one of the conductors and mounting a magnetic field sensor in this notch is an expensive solution. Furthermore, the problem of the influence of the magnetic fields generated by the neighboring strong current conductors is still not solved, which limits the possibilities for reducing the bulkiness of the measuring device.

SUMMARY

An object of the invention is to provide a compact and not very expensive three-phase current sensor, in particular for measuring strong currents. By "strong currents", are meant high intensity currents taking into account the distances separating the three phases and the bulkiness of the sensor.

It is advantageous to provide a three-phase current sensor which may easily be installed and connected in a three-phase conduction system such as the power supply system of a three-phase electric motor.

It is advantageous to provide a three-phase current sensor which is not very sensitive to external fields, for example produced by electric conductors positioned in proximity to the sensor.

It is advantageous to provide a three-phase current sensor which provides good precision for measuring an electric current over a large current amplitude range.

In the present application, a three-phase current sensor is described for measuring currents flowing in a three-phase conduction system, comprising a first magnetic measurement device and a second magnetic measurement device, each magnetic measurement device comprising a magnetic circuit comprising at least two gaps and a magnetic field detector positioned in each gap of the magnetic circuit. The magnetic measurement devices are positioned on either side of a central conductor portion, or of a cavity for inserting a central conductor forming one of the three phases of the conduction system.

Preferably, said at least two gaps of each magnetic circuit of the magnetic measurement devices are substantially positioned in a same plane.

Preferably, axes of three conductor portions crossing the sensor or axes of the three cavities for inserting the three conductors, are substantially parallel and positioned in said plane of the gaps.

Preferably, the magnetic detectors positioned in the gaps are Hall effect sensors made as ASICS.

In the preferred embodiment, there are two magnetic circuits and two gaps in each magnetic circuit, the gaps being aligned in a same plane with the portions of primary conductors crossing the sensor, or with the axes of the cavities for inserting the primary conductors crossing the sensor, both magnetic circuits being positioned on either side of a conductor on one of the phases or of a cavity for inserting a conductor of one of the phases. The central primary conductor therefore has no magnetic measurement device.

Preferably, the magnetic measurement devices are mounted on a common supporting plate. This supporting plate may form a wall forming a portion of the casing of the sensor in which magnetic circuits are mounted. The supporting plate may also comprise a circuit with electronics for processing the signals.

In the present application, a method for measuring currents which flow in a three-phase conduction system by means of a current sensor is also described, which comprises a first magnetic measurement device and a second magnetic measurement device, the method comprising:

measuring the current flowing in a first of the three phases from the measurement of the magnetic field generated by said current of this first phase by the first magnetic device, measuring the current flowing in a third of the three phases from the measurement of the magnetic field generated by said current of this third phase by the second magnetic device, and measuring the current of a second of the three phases from the influence of the magnetic field generated by the current of this second phase on the first and second magnetic devices.

Other advantageous aspects and objects of the invention will become apparent from the claims, from the detailed description of embodiments hereafter and from the appended drawings wherein:

Figure 1A:
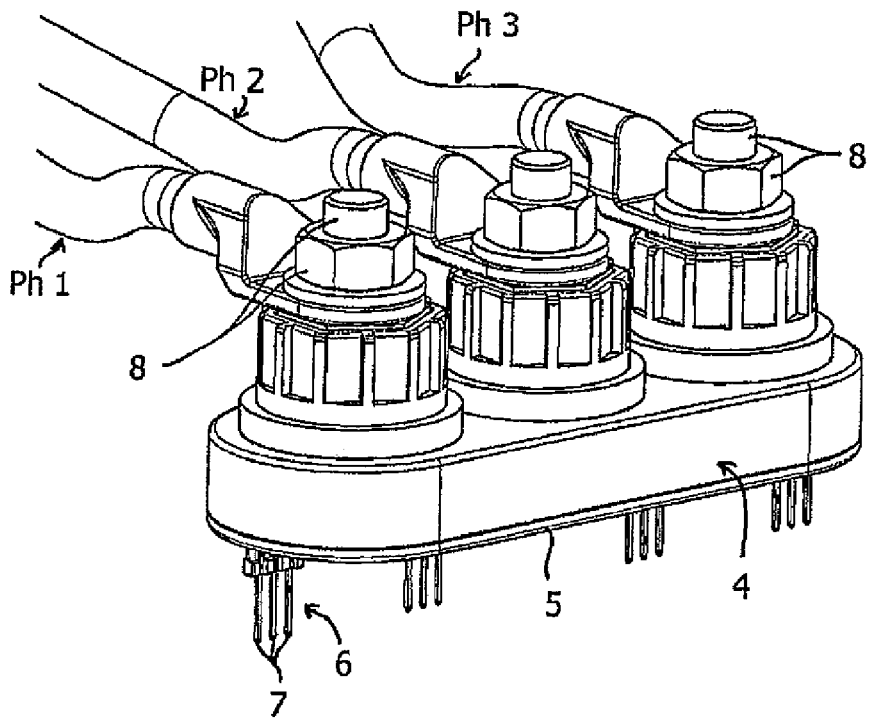
FIG. 1a is a perspective view of a three-phase current sensor according to a first embodiment of the invention.

With reference to the figures, a current sensor 1 for measuring the electric current flowing in three conductors Ph1, Ph2, Ph3 corresponding to the three phases of a conduction system—i.e. an electrical power supply or generation system—comprises devices D1, D3, for detecting the magnetic field, a casing 4 and a support 5. The support 5 may form one of the external walls of the casing 4. In another embodiment, the support 5 comprises a circuit board such as a printed circuit, on which electric components may be positioned for processing measurement signals or even other functions for controlling and monitoring the sensor and/or for transmitting data to display or control units of the motor. For this purpose, it is possible to provide electric terminals 6 mounted on the circuit board, or simply connected to the magnetic detection devices, in order to allow the circuit to be interconnected to external electronics.

The magnetic field measurement devices D1, D3 comprise a magnetic circuit M having at least two circuit portions M1, M2, M3, M4 separated by gaps E1, E2, E3, E4 and magnetic field detectors C1, C2, C3, C4 positioned in each gap E1, E2, E3, E4. The detectors of magnetic fields are preferably Hall effect sensors incorporated in an ASIC and provided with connecting terminals 7. The Hall effect sensors are well known and there is therefore no need to describe them here.

Other detectors of magnetic fields may also be used instead of Hall effect detectors.

The magnetic circuits M may be formed with stacked soft material sheets, having a substantially annular shape as illustrated, but they may also have other shapes such as square, rectangular, polygonal shapes. The magnetic field measurement devices D1, D3 are mounted onto the ends of the sensor, in order to surround the conductors Ph1, Ph3 positioned on either side of the central conductor Ph2. The three conductors bearing the three phases are therefore positioned substantially parallel in a same plane at the location where they cross the sensor.

Figure 1B:
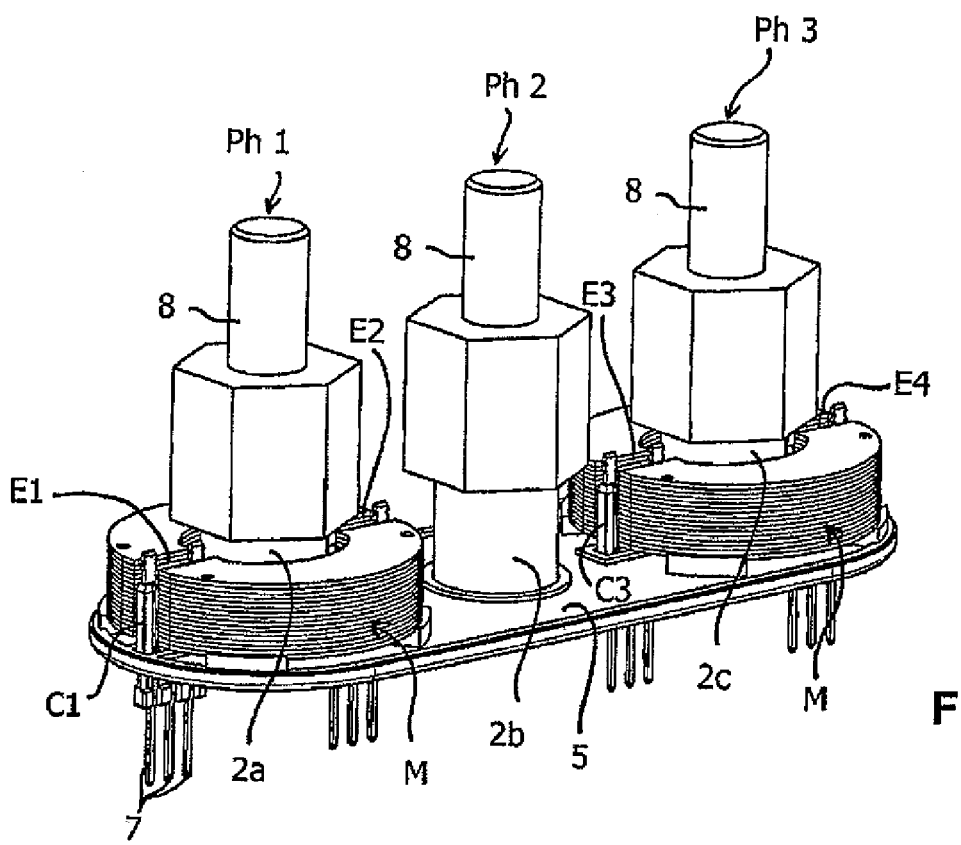
FIG. 1b is a perspective view of the sensor of FIG. 1a without any casing.

In a first embodiment (FIGS. 1a, 1b), conductor portions 2a, 2b, 2c crossing the sensor, may be directly integrated into the sensor and comprise terminals 8 for connecting the three conductors Ph1, Ph2, Ph3.

Figure 2A:
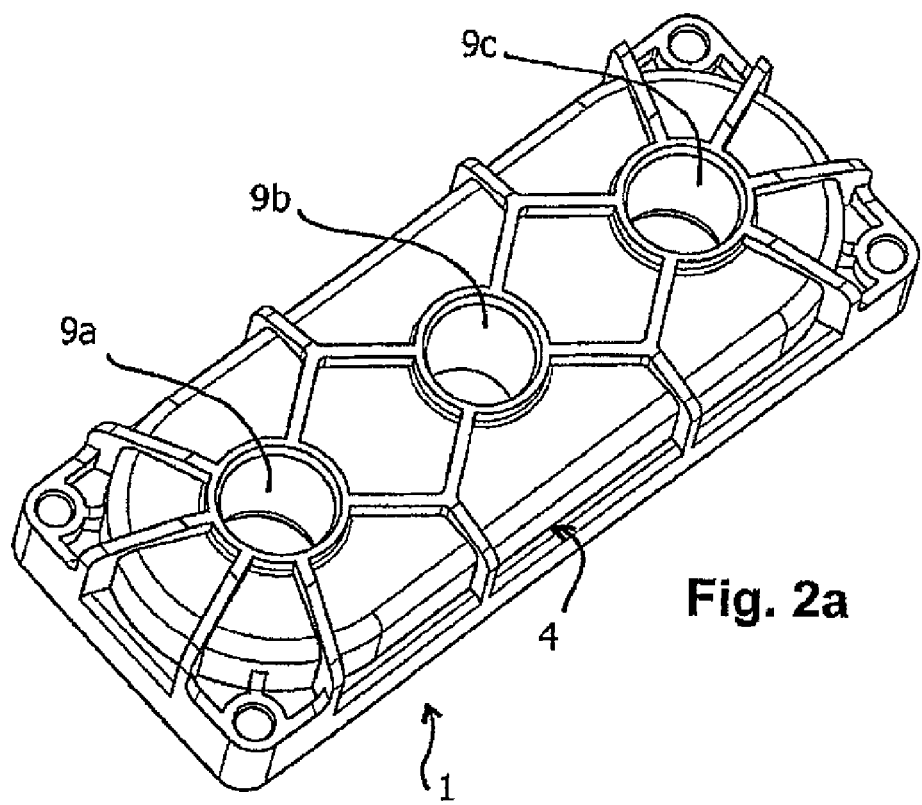
FIGS. 2a and 2b are perspective views of a three-phase current sensor according to a second embodiment of the invention.
Figure 2B:
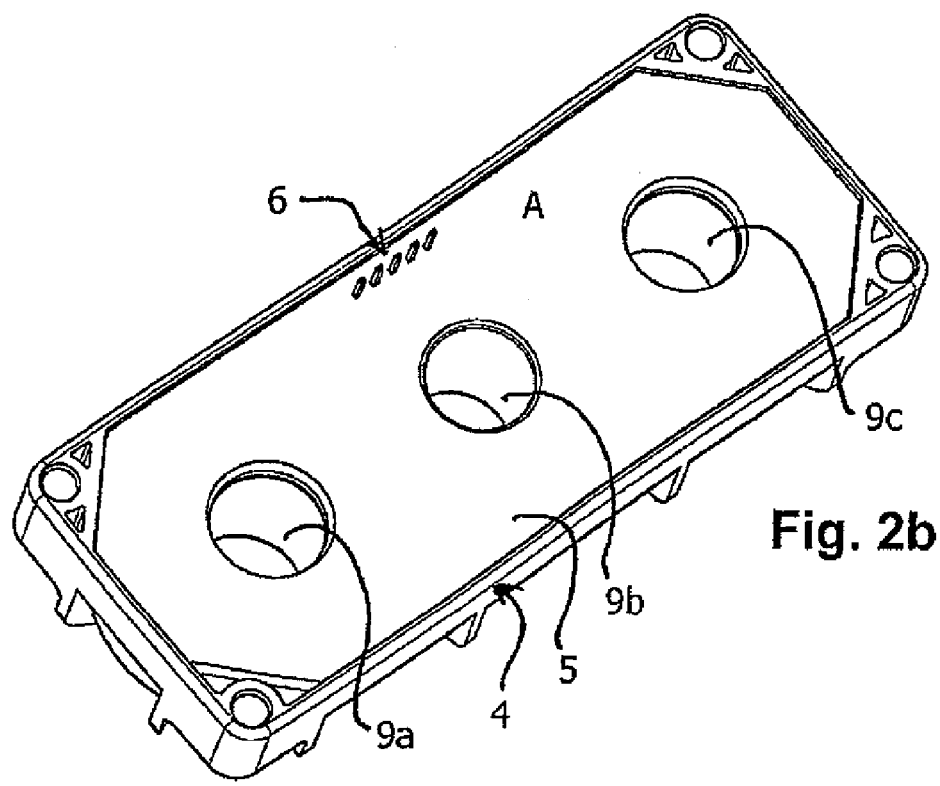
Figure 2C:
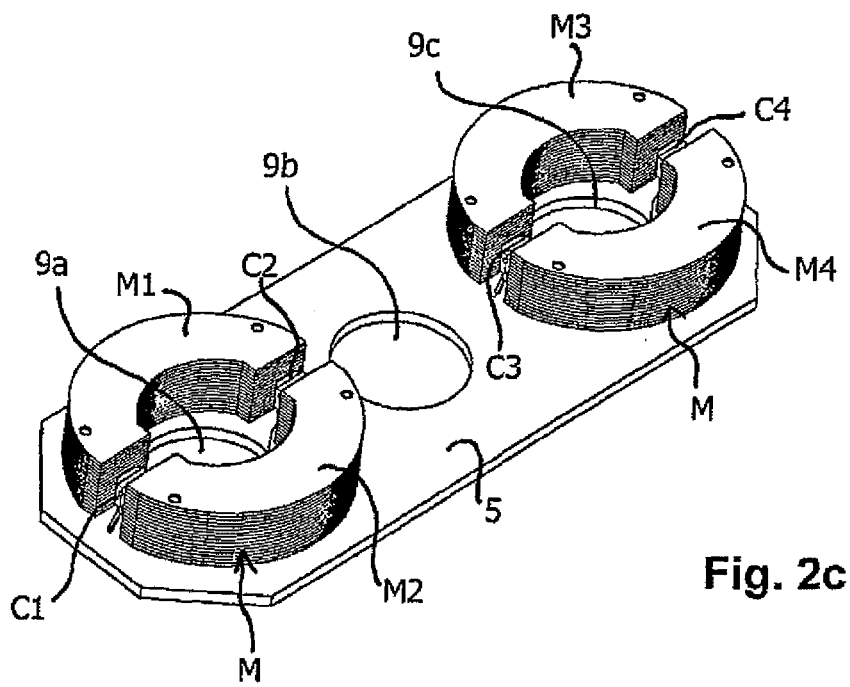
FIG. 2c is a perspective view of a portion of the current sensor of FIGS. 2a and 2b, without any casing.

In another embodiment shown in FIGS. 2a-2c, the sensor may be provided with passages 9a, 9b, 9c into which the three external conductors are inserted, for crossing the sensor. In this embodiment, it would also be possible to form the sensor in two portions, separated by the axis/median plane A, in order to be able to mount the sensor around the three conductors without having to insert the conductors or to interrupt them. As the magnetic circuits M each have two gaps E1, E2, E3, E4 which are positioned in the same alignment plane A of the three primary conductors 2a, 2b, 2c, the making of a sensor in two portions is facilitated.

With reference to FIGS. 3 and 4a-4c, we shall now explain the operating principle of the sensor according to the invention.

Figure 3:
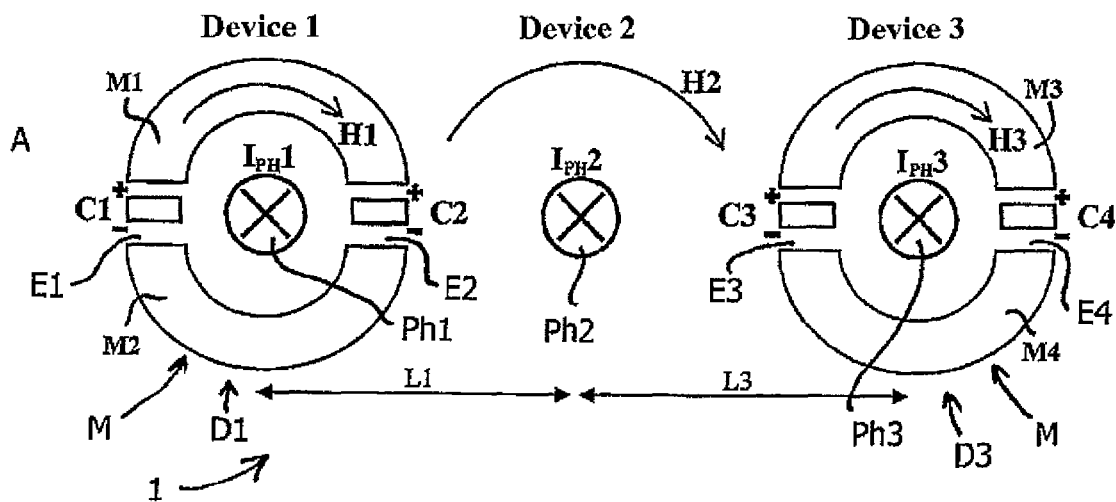
FIG. 3 is a simplified illustration of the current sensor according to the invention for explaining its operating principle.

With reference to FIG. 3, the three-phase sensor groups three phases of currents to be measured $I_{PH}1$, $I_{PH}2$, $I_{PH}3$, and the magnetic measurement devices D1, D3. In certain applications, the mechanical dimensions should be reduced in order to take into account miniaturization requirements. This poses the problem of magnetic perturbations (proximity of the current bars relatively to each other) which may produce very large measurement errors.

In the invention, magnetic perturbations are used as elements participating in elaborating the measurements and not as perturbing elements.

Preferably, the three current phases $I_{PH}1$, $I_{PH}2$, $I_{PH}3$ flow in conductor portions 2a, 2b, 2c (phases Ph1, Ph2, Ph3) and are positioned on a same plane. The distances (L1, L3) between the phases Ph1 and Ph2, Ph2 and Ph3, may be of any value, but preferably L1=L3 in order to simplify the algorithms. It is also desirable that L1 and L3 be of a sufficiently small magnitude in order to benefit from the advantage of the system.

The measurement elements comprise four Hall cells C1, C2, C3, C4 for induction measurements and four portions of magnetic circuits M1, M2, M3, M4 for concentrating magnetic fields. The Hall cells and the gaps E1, E2, E3, E4 formed by the magnetic circuits are positioned on the same axis/plane A as the current bars 2a-2c.

The first magnetic measurement device D1 allows measurement of the current of the first phase $I_{PH}1$. It comprises the phase Ph1 (bar bus), two Hall cells (cell C1, cell C2) and two portions of magnetic circuits (M1, M2) separated by the gaps E1, E2.

The magnetic measurement device D3 allows measurement of the current of the third phase $I_{PH}3$. It comprises the phase Ph3 (bar bus), two Hall cells (cell C3, cell C4) and two portions of magnetic circuits (M3, M4) separated by the gaps E3, E4.

There is no magnetic measurement device around the phase Ph2. It comprises the phase $I_{PH}2$ (bar bus). The magnetic measurement devices D1, D3 are used for making up the measurement of the current of the second phase $I_{PH}2$.

In FIG. 3, it is assumed that the direction of the current in the phases is positive when the current enters the device (illustrated by a cross). Under these conditions, the magnetic fields H1, H2, H3 flow in the clockwise direction.

The output signals provided by the system are defined by a quantity which represents the image of the current which flows in the phases of current. These signals S1, S2, S3 may be continuous electrical signals, for example a voltage or a current, a digital signal, for example a serial wire or radiofrequency link protocol. Any type of transmission link may be used.

S1=output signal of the system which illustrates the image of $I_{PH}1$

S2=output signal of the system which illustrates the image of $I_{PH}2$

S3=output signal of the system which illustrates the image of $I_{PH}3$.

In order to facilitate the demonstration, we assume that the Hall cells C1, C2, C3, C4 were calibrated in situ so that the sensitivity of the four elements is the same. The signals provided by the Hall cells are positive for an induction from top to bottom as in FIG. 3. In the following relationships, we consider that:

C1=signal of the Hall cell C1
C2=signal of the Hall cell C2
C3=signal of the Hall cell C3
C4=signal of the Hall cell C4

The phases Ph1 and Ph3 are characterized by the following relationships:

$$S1=S(I_{PH}1)=(C2-C1)*K1$$

wherein K1=sensitivity (gain) of the magnetic measurement device D1

$$S3=S(I_{PH}3)=(C4-C3)*K3$$

wherein K3=sensitivity (gain) of the measurement device D2

Coefficients K1 and K3 are the transformation ratios to be applied on the signals of the Hall cells in order to obtain the physical quantity of the output signal S(x). Under the retained assumption of a device having identical sensitivities, we may write:

$$K1=K3=K$$

Relationships S1 and S3 become:

$$S1=S(I_{PH}1)=(C2-C1)*K$$

$$S3=S(I_{PH}3)=(C4-C3)*K$$

wherein K=sensitivity (gain) of the devices D1 and D3

The system offers the possibility of calculating the signal S2 by means of the magnetic measurement devices D1, D3 without having a central magnetic measurement device. Measurement of $I_{PH}2$ may advantageously be calculated according to the following relationship:

$$S2=S(I_{PH}2)=(C4+C3)*K23-(C2+C1)*K21$$

wherein

K21=sensitivity (gain) of the influence of the current of phase 2 on the magnetic device of phase 1

K23=sensitivity (gain) of the influence of the current of phase 2 on the magnetic device of phase 3

The coefficients K21 and K23 are the transformation ratio to be applied on the signals from the Hall cells in order to obtain the physical quantity of the output signal $S(I_{PH}2)$. Under the retained assumption of a device having identical sensitivities, we may write:

$$K21=K23=K2$$

$$S2=S(I_{PH}2)=(C4+C3-C2-C1)*K2, \text{wherein}$$

K2=sensitivity (gain) of the influence of the current of phase 2 on the magnetic devices of phases 1 and 3

The relationships above are valid under the following conditions:

- The three current phases $I_{PH}1, I_{PH}2, I_{PH}3$ are positioned on a same plane and the axes on a straight line.
- The distances between the phases are equal (I1=I3).
- The magnetic circuit portions M1, M2, M3, M4 are of identical shapes and positioned around the phases Ph1 and Ph3 symmetrically.
- The magnetic gaps which separate the magnetic circuits are identical (E1=E2=F3=E4).
- The magnetic measurement elements (Hall cell) are calibrated in situ so that the sensitivity of each element is of a known and identical value, $S_{C1}=S_{C2}=S_{C3}=S_{C4}$.

This calibration corrects all the dimensional, positioning, symmetry and sensitivity errors of all of the elements of the magnetic measurement devices D1 and D3.

These arrangements provide simplification of the calculations of the signals S1, S2 and S3 so as to only keep a single gain coefficient K2 for S2 and a gain coefficient K for S1 and S3.

Other arrangements of the magnetic measurement devices, for example where the three phases are not on the same axis/plane, are possible and allow the output signals of the three phases to be calculated. In this case however, more sensitivity coefficients have to be used in order to obtain an accurate result.

In the demonstration above, we have taken as an assumption the use of infinite primary current bars, and therefore without the effect of the magnetic fields of the current returns of the power circuit. Integration of the sensor into the power subassembly may introduce errors for calculating the output signals S2, which would only have an influence on the accuracy of the calculation of the leakage currents.

The course of the power circuits is known and controlled, it is possible to integrate magnetic perturbations from the return currents into the calculation of the sensitivity coefficients. The calibration system of the sensor should take this magnetic environment into account for adjusting the sensitivity of each Hall cell in order to obtain the desired sensitivity coefficients K.

In the case of symmetrical magnetic perturbations on the measurement devices D1 and D3, the simplified coefficients K and K2 are sufficient for calculating the output signals. If the magnetic perturbations are asymmetrical then multiple coefficients (K21, K23) have to be introduced.

To summarize, the relationships above allow the currents of the three phases to be calculated with two magnetic measurement devices D1 and D3. With the design of the magnetic measurement devices, it is possible to obtain excellent measurement accuracy on the phases Ph1 and Ph3 in spite of the proximity of the central phase Ph2.

Measurement of the central phase Ph2 is provided with good accuracy in the absence of an uncontrolled perturbing magnetic field. In this case, we may take the signal S2 into account for measuring $I_{PH}2$.

In the case of an intense perturbing magnetic field and uncontrolled by the measurement system, $I_{PH}2$ measurement errors appear. If the $I_{PH}2$ measurement accuracy is insufficient, we may apply the following relationship:

$$S2=-(S1+S3)$$

In this case, the signal S2 may advantageously be used for verifying the relationship $$I_{PH}1+I_{PH}2+I_{PH}3=0$$

This allows leakage currents to be detected with sufficient accuracy and the triggering of a procedure for operating in a degraded mode.

The system provides sufficient redundancy for conducting the measurement with a limited number of Hall cells, and for then handling the degraded modes.

The triggering of an operation in a degraded mode may be performed if one of the four magnetic field measurement cells C1, C2, C3, C4 is faulty. In principle, when a Hall effect cell is faulty, it no longer delivers an output signal. This is easily detectable in systems for controlling three-phase motors. Indeed, the controlling computer controls the current in the phases and expects to read variations in the output signals of the Hall cells. In the absence of any variation in the signal from a cell, the computer may declare the cell as being non-operative and trigger an operation in a degraded mode.

The degraded mode will take into account the three cells which are still operative and calculate the signals S1, S2 and S3 according to a new formulation. There are four modes of degraded operation depending on the faulty Hall cell:

Failure of C1:

$$S1=S(I_{PH}1)=C2*K11+(C4+C3)*K111$$

K11=S1 sensitivity//failure of C1

K111=S1 correction coefficient//failure of C1

$$S3=S(I_{PH}3)=(C4-C3)*K31$$

K31=S3 sensitivity//failure of C1

$$S2=S(I_{PH}2)=(C3=C2)*K21$$

K21=S2 correction coefficient//failure of C1

Failure of C2:

$$S1=S(I_{PH}1)=C1*K12+(C4+C3)*K121$$

K12=S1 sensitivity//failure of C2

K121=S1 correction coefficient//failure of C2

$$S3=S(I_{PH}3)=(C4-C3)*K32$$

K32=S3 sensitivity//failure of C2

$$S2=S(I_{PH}2)=(C3-C1)*K22$$

K22=S2 correction coefficient//failure of C2

Failure of C3:

$$S1=S(I_{PH}1)=(C2-C1)*K13$$

K13=S1 sensitivity//failure of C3

$$S3=S(I_{PH}3)=C4*K33+(C1+C2)*K331$$

K33=S3 sensitivity//failure of C3

K331=S3 correction coefficient//failure of C3

$$S2=S(I_{PH}2)=(C4-C1)*K23$$

K23=S2 sensitivity//failure of C3

Failure of C4:

$$S1=S(I_{PH}1)=(C2-C1)*K14$$

K14=S1 sensitivity//failure of C4

$$S3=S(I_{PH}3)=C3*K34+(C1+C2)*K341$$

K34=S3 sensitivity//failure of C4

K341=S3 correction coefficient//failure of C4

$$S2=S(I_{PH}2)=(C3-C2)*K24$$

K24=S2 correction coefficient//failure of C4

As the influent parameters have been selected earlier (equality and symmetry), we may simplify the relationship:

X1=K11=−K34

X2=K111=K341

X3=K12=K33

X4=K121=−K331

X5=K21=K24

X6=K22=K23

X7=K13=K14=K31=K32

And the simplified relationships become:

Signal S1:

Failure of C1: $S1=S(I_{PH}1)=C2*X1+(C4+C3)*X2$.

Failure of C2: $S1=S(I_{PH}1)=C2*X3+(C4+C3)*X4$.

Failure of C3 or C4: $S1=S(I_{PH}1)=(C2-C1)*X7$.

Signal S2:

Failure of C1 or C4: $S2=S(I_{PH}2)=(C4-C1)*X5$.

Failure of C2 or C3: $S2=S(I_{PH}2)=(C4-C1)*X6$.

Signal S3:

Failure of C1 or C2: $S3=S(I_{PH}3)=(C4-C3)*X7$.

Failure of C3: $S3=S(I_{PH}3)=C4*X3-(C1+C2)*X4$.

Failure of C4: $S3=S(I_{PH}3)=(C1+C2)*X2-C3*X1$.

With the degraded mode, it is possible to maintain operation of the sensor if one at most of the four cells is not operational. The performances of the sensor are not as good, notably as regards immunity to external magnetic fields (parasitic fields, return current), but the degraded mode provides an acceptable temporary emergency solution until the next maintenance operation.

The system is particularly adapted to the measurement of three-phase current with a high value, for example of the order of magnitude of a few thousand amperes (1,000 A to 2,000 A or more), while using open loop type measurement devices.

The advantages are:

Low cost open loop technology

Measurement of currents above 1,000 A without any saturation of the magnetic circuits Compact mechanical design Measurement of the three current phases with only two magnetic measurement devices Insensitivity to uniform external magnetic fields Insensitivity to return currents flowing in the plane of the three current phases.

Figure 4A:
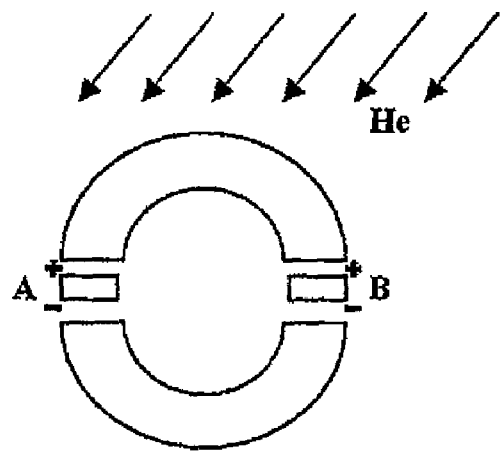
FIGS. 4a-4c are simplified diagrams of a portion of the current sensor according to the invention, used for explaining its operating principle.

FIG. 4a shows the influence of an external magnetic field on the sensor. The external magnetic field He produces a positive signal on the cell B and a positive signal on the cell A. One therefore has the relationship:

$$S(He)=k*(B-A)=0$$

This device is therefore protected against external uniform fields.

Figure 4B:
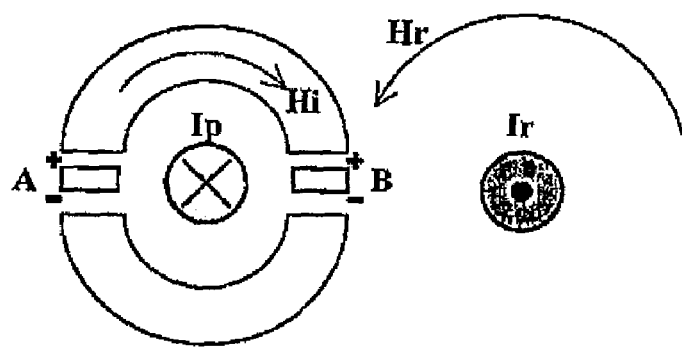

FIG. 4b illustrates the influence of the return currents. Ir is the return current and Hr is the field produced by Ir. The field Hi produces a positive signal on the cell B and a negative signal on the A cell. One therefore has the relationship:

$$S(Ip)=k*(B-A).$$

The field Hr produces a positive signal on cell B and a positive signal on cell A.

$$S(Ip)=k*(B-A)=0$$

One therefore has the relationship:

$$S=S(Ip)+S(Hr)=k*(B-A).$$

The sensor according to the invention is therefore better protected against external fields than the devices with a single gap.

Figure 4C:
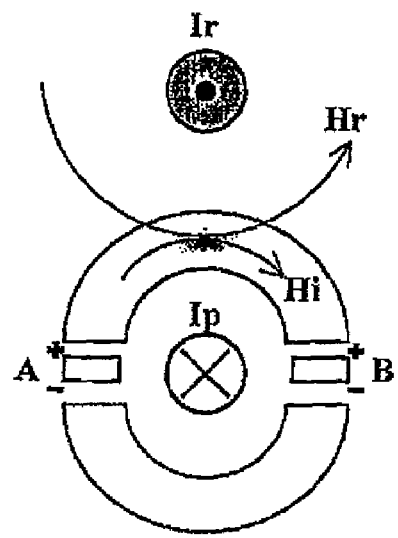

FIG. 4c illustrates the influence of the return currents perpendicular to the axis of the gaps. As in the previous case, the field Hr has no influence on the signal S:

$$S = S(Ip)$$

This device produces a significant induction level in the magnetic circuit. The field Hr concentrated by the magnetic circuit will be added to the field Hi. Saturation of the magnetic circuit may be attained, producing a non-linearity of the measurement system. The positioning of a current return according to the configuration of FIG. 4c is therefore less favorable than the other configurations discussed earlier.

The invention claimed is:

1. A three-phase current sensor for measuring currents flowing in a three-phase conduction system, comprising first and second magnetic measurement devices, each magnetic measurement device comprising a magnetic circuit comprising at least two gaps, and a magnetic field detector positioned in each gap of the magnetic circuit, the first and second magnetic measurement devices including said magnetic circuits being positioned on either side of a central conductor forming one of the three phases of the conduction system not having any magnetic measurement device, or of a cavity for inserting a central conductor forming one of the three phases of the conduction system not having any magnetic measurement device.

2. The sensor according to claim 1, wherein said at least two gaps of each magnetic circuit of the magnetic measurement devices are essentially positioned in a same plane.

3. The sensor according to claim 2, wherein axes of three conductor portions crossing the sensor, or axes of the three cavities for inserting the three conductors, are essentially parallel and positioned in said plane of the gaps.

4. The sensor according to claim 1, wherein the magnetic field detectors positioned in the gaps are Hall effect sensors.

5. The sensor according to claim 1, wherein there are two magnetic circuits and two gaps in each magnetic circuit.

6. The sensor according to claim 1, wherein the magnetic measurement devices are mounted on a common supporting plate.

7. The sensor according to claim 6, wherein the supporting plate forms a wall which is a portion of a casing of the sensor in which the magnetic circuits are mounted.

8. The sensor according to claim 6, wherein the supporting plate comprises a circuit with electronics for processing the signals.

* * * * *